(12) United States Patent
Cheng et al.

(10) Patent No.: US 7,897,501 B2
(45) Date of Patent: Mar. 1, 2011

(54) METHOD OF FABRICATING A FIELD-EFFECT TRANSISTOR HAVING ROBUST SIDEWALL SPACERS

(75) Inventors: Chien-Li Cheng, Hsinchu (TW); Sun-Jay Chang, Taitung County (TW); Tung-Heng Hsieh, Hsinchu County (TW); Yung-Shen Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/013,528

(22) Filed: Jan. 14, 2008

(65) Prior Publication Data

US 2008/0268602 A1    Oct. 30, 2008

Related U.S. Application Data

(60) Provisional application No. 60/913,822, filed on Apr. 25, 2007.

(51) Int. Cl.
*H01L 21/4763* (2006.01)

(52) U.S. Cl. ................ 438/595; 438/757; 257/E21.626; 257/E21.64; 257/E21.627

(58) Field of Classification Search ................ 438/703, 438/595, 757; 257/E21.626, E21.64, E21.593, 257/E21.636, E21.622; 216/109, 108
See application file for complete search history.

(56) References Cited

U.S. PATENT DOCUMENTS

| | | | |
|---|---|---|---|
| 6,238,986 B1 * | 5/2001 | Kepler et al. | 438/301 |
| 6,316,304 B1 * | 11/2001 | Pradeep et al. | 438/230 |
| 6,448,167 B1 | 9/2002 | Wang et al. | |
| 6,482,726 B1 * | 11/2002 | Aminpur et al. | 438/585 |
| 6,815,320 B2 * | 11/2004 | Kim et al. | 438/585 |
| 6,991,991 B2 | 1/2006 | Cheng et al. | |
| 7,323,377 B1 * | 1/2008 | Sedigh et al. | 438/197 |
| 7,495,280 B2 * | 2/2009 | Lo | 257/314 |
| 7,544,556 B1 * | 6/2009 | Mui et al. | 438/199 |
| 2006/0121713 A1 * | 6/2006 | Yu et al. | 438/592 |
| 2007/0138573 A1 * | 6/2007 | Kashihara et al. | 257/382 |
| 2008/0261385 A1 * | 10/2008 | Jawarani et al. | 438/517 |

* cited by examiner

*Primary Examiner* — Caridad M Everhart
(74) *Attorney, Agent, or Firm* — Thomas, Kayden, Horstemeyer & Risley

(57) ABSTRACT

A method of fabricating a semiconductor device is disclosed. The method of fabricating a semiconductor device provides a semiconductor substrate; forming a gate stack overlying the semiconductor substrate; forming spacers each having a first inner spacer and a second outer spacer on sidewalls of the gate stack; forming a protective layer on sidewalls of the spacers, covering a part of the semiconductor substrate, wherein an etching selectivity of the protective layer is higher than that of the first inner spacer.

21 Claims, 4 Drawing Sheets

METHOD OF FABRICATING A FIELD-EFFECT TRANSISTOR HAVING ROBUST SIDEWALL SPACERS

BACKGROUND OF THE INVENTION

1. Field of the Invention

The invention relates to a method of fabricating a semiconductor device, and more particularly to a method for fabricating of a semiconductor device with offset spacers.

2. Description of the Related Art

As MOSFET and CMOS device characteristic sizes are scaled below 0.1 microns, the process window for wet and dry etching processes for achieving desired critical dimensions are increasingly difficult. For example, in forming dielectric offset spacers, also referred to as sidewall spacers, it is particularly difficult to control the width of offset spacers and offset spacer liners with increasingly stringent process windows as device critical dimensions decrease. For example, the width of the offset spacer may be as small as 100 Angstroms (10 nanometers) or less in 65 nanometer critical dimension (gate length) CMOS devices.

A pair of offset spacers is formed adjacent to either side of the gate structure (gate dielectric and gate electrode) allowing the formation of source/drain regions thus enabling the offset spacers to act as an ion implant shield for forming a relatively higher doping level of n-type or p-type doping over source/drain (S/D) regions adjacent a lower doping level source drain extension (SDE) doped region formed adjacent the channel region underlying the gate dielectric.

As device critical dimensions (CD) shrink, achieving close dimensional tolerances of offset spacers is critical to achieving reliable electric performance and avoiding short channel effects (SCE). For example, source-drain extension (SDE) regions affect SCE according to both depth and width of the SDE doped region. The width of the offset spacers determines at least the width of the SDE regions. Offset spacer formation typically requires both deposition and etching processes, for example, to first deposit and subsequently remove portions of deposited dielectric layers. As device sizes shrink below about 0.13 microns both the deposition process and the etching process have extremely narrow process windows whereby dimensional variation undesirably alters CD and electrical performance of the CMOS device.

Conventional processes have typically included an oxide liner formed adjacent the gate electrode prior to formation of overlying nitride layers for forming the offset spacer. Generally in the spacer formation process, an oxide etching step is required to etch back a portion of the oxide liner overlying the gate electrode prior to carrying out subsequent processes such as silicide formation. Generally, the oxide liner layer is etched back by a wet etching process, which in conventional processes has caused undesirable undercut etching of the oxide liner in the oxide liner portion overlying the silicon substrate, for example in the SDE region. As a result, the critical widths of the offset spacer are compromised, leading to degradation of subsequent processing steps such as silicide formation over the source/drain region and leading to device performance degradation such as short channel effects (SCE) or gate oxide integrity (GOI).

Structures and fabrication methods have therefore been explored to solve the described problems. U.S. Pat. No. 6,448,167 B1 describes a composite insulator spacer on the sides of a MOSFET. Referring to FIG. 1a, an annealing procedure is used for both activation of the lightly doped source/drain region 4, and densification of the thin silicon oxide layer 5b. The etching rate of the densified silicon oxide layer 5b, in diluted hydrofluoric (HF) acid procedures is reduced, thus the underlying silicon oxide layer 5b of the composite insulator spacer reduces undercutting. The HF etching loss of the densified silicon oxide layer, however, is unavoidable. Device performance suffers from additional thermal budget, and fabrication costs are also increased.

U.S. Pat. No. 6,991,991 B2 discloses a method for preventing formation of a spacer undercut in the selective epitaxial growth (SEG) precleaning process. Referring to FIG. 1b, the method utilizes HF diluted by ethylene glycol (HFEG) solution to simultaneously etch a silicon oxide spacer 29A and a silicon nitride spacer; 29B of a spacer 29, for preventing spacer undercut. At the same time a native oxide layer upon a surface of a semiconductor substrate 20 is removed. Because nitride and oxide have an etching selectivity of about 2:1, thus reducing spacer undercutting. The HF etching loss of the silicon oxide spacer, however, is unavoidable.

Thus, a novel and reliable method of fabricating a semiconductor device with more robust sidewall spacer avoiding width altering effects of subsequent etching processes to thereby improve device performance is desirable.

BRIEF SUMMARY OF INVENTION

A detailed description is given in the following embodiments with reference to the accompanying drawings.

To solve the described and other problems, a method for fabricating a semiconductor device is provided. An exemplary embodiment of a method for fabricating a semiconductor device comprises: providing a semiconductor substrate; forming a gate stack overlying the semiconductor substrate; forming spacers, each comprising an first inner spacer and an second outer spacer on sidewalls of the gate stack; forming a protective layer on sidewalls of the spacers, covering a part of the semiconductor substrate, wherein an etching selectivity of the protective layer is higher than that of the first inner spacer.

Another exemplary embodiment of a method for fabricating a semiconductor device comprises: providing a semiconductor substrate; forming a gate stack on the semiconductor substrate; forming first inner spacers and second outer spacers on sidewalls of the gate stack; forming a protective layer covering a part of the first inner spacers, the second outer spacers and the semiconductor substrate, wherein the protective layer has an etching selectivity of about 5 to 100 to diluted hydrofluoric (HF) acid.

Yet another exemplary embodiment of a method for fabricating a semiconductor device comprises: providing a semiconductor substrate; forming a gate stack overlying the semiconductor substrate; forming spacers each comprising an first inner spacer and an second outer spacer on sidewalls of the gate stack; forming a protective layer on sidewalls of the spacers, sealing a bottom portion of the first inner spacer, wherein an etching selectivity of the protective layer is higher than that of the first inner spacer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
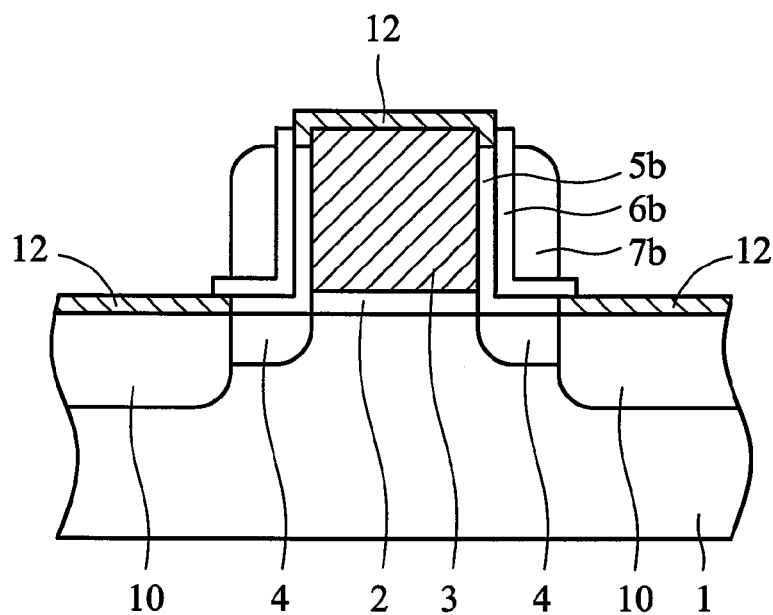
FIG. 1a shows a cross section of a conventional metal oxide semiconductor field effect transistor (MOSFET, subsequently referred to as "MOS") device.
Figure 1B:
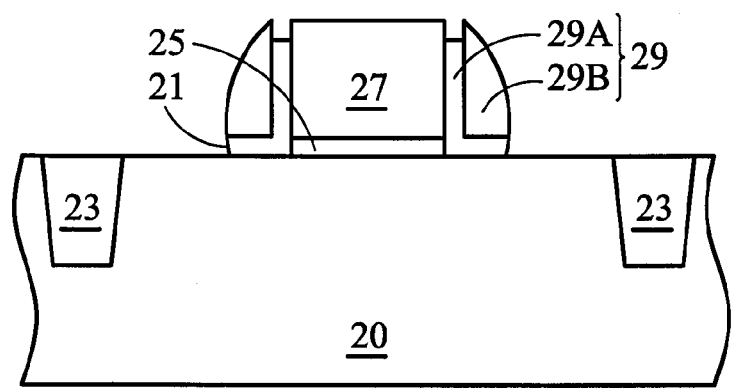
FIG. 1b shows a cross section of another conventional MOS device.

The following description is of the best-contemplated mode of carrying out the invention. This description is made for the purpose of illustrating the general principles of the invention and should not be taken in a limiting sense. The scope of the invention is best determined by reference to the appended claims.

FIGS. 2 to 6 show cross sections of an exemplary embodiment of a method of fabricating a semiconductor device. Wherever possible, the same reference numbers are used in the drawing and the description to refer the same or like parts.

Figure 2:
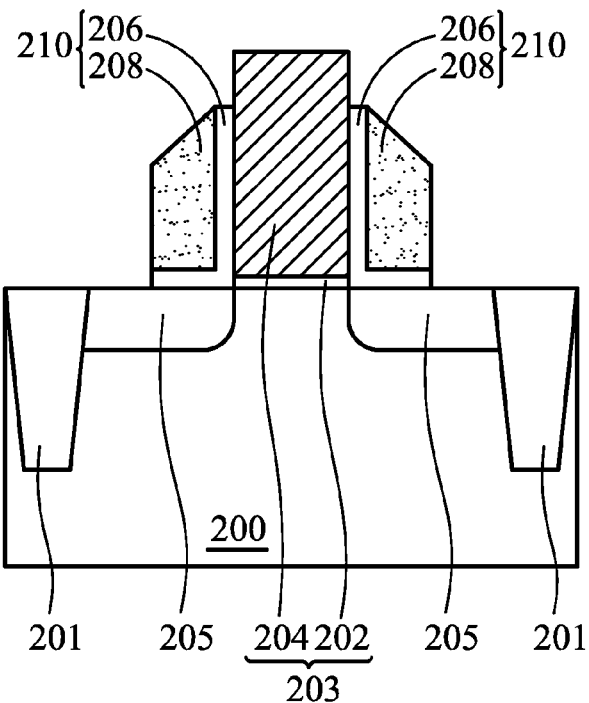
FIGS. 2 to 6 show cross sections of an exemplary method for fabricating a semiconductor device of the invention.

Referring to FIG. 2, a semiconductor substrate 200 is provided. The semiconductor substrate 200 may comprise silicon, SiGe, bulk semiconductor, strained semiconductor, compound semiconductor, silicon on insulator (SOI), stacked SOI (SSOI), stacked SiGe on insulator (S—SiGeOI), SiGeOI, GeOI and other commonly used semiconductor substrates. The semiconductor substrate 200 is preferably p-type. Alternatively, the semiconductor substrate 200 may comprise an n-type substrate.

Isolation structures 201 in the semiconductor substrate 200 may be formed. For example, a pad oxide layer and a silicon nitride layer (not shown) are formed on the semiconductor substrate 200 in sequence. A trench (not shown) is then formed in the semiconductor substrate 200 to define an active region (not shown) during the step of etching the pad oxide layer, the silicon nitride layer and the semiconductor substrate 200. A liner layer and an insulating layer such as oxide are formed by high density plasma CVD (HDP CVD) or CVD in the trench in sequence. The insulating layer is then planarized by chemical mechanical polishing (CMP) using the silicon nitride layer as a CMP stop layer. Finally, the silicon nitride layer is removed by wet etching, such as submersion in hot phosphoric acid ($H_3PO_4$), to form shallow trench isolations (STI) 201 in the semiconductor substrate 200.

A gate stack 203 is then formed overlying the semiconductor substrate 200. The gate stack 203 may comprise a gate dielectric layer 202 and a gate electrode layer 204 thereon. The gate dielectric layer 202 may comprise silicon dioxide, silicon nitride, silicon oxynitride, aluminum oxide ($Al_2O_3$), hafnium oxide ($HfO_2$), hafnium oxynitride (HfON), hafnium silicate ($HfSiO_4$), zirconium oxynitride (ZrON), zirconium silicate ($ZrSiO2_4$), yttrium oxide ($Y_2O_3$), lanthanum oxide ($La_2O3$), cerium, cerium oxide ($CeO_2$), titanium oxide ($TiO_2$), tantalum oxide ($Ta_2O_5$) or combinations thereof formed by, for example, thermal oxidation, chemical vapor deposition (CVD) or similar. The gate dielectric layer 202 may also include high-k dielectric materials such as oxygen-containing dielectric, nitrogen-containing dielectric, or combinations thereof. The gate electrode layer 204 may comprise an in-situ doped silicon layer or a conductive layer doped by implanting impurities. The term "in-situ doped silicon layer" means that the silicon layer is implanted with impurities in one process step without an additional implantation process step. In the implantation process introducing the mixture of reactive gas and impurities in one deposition tool forms step the silicon layer. The gate electrode layer 204 may comprise polysilicon, amorphous silicon, doped polysilicon or polysilicon-germanium formed by low pressure CVD (LPCVD), atomic-layer CVD (ALCVD) or other deposition processes in an ambient containing phosphorus and silane at a temperature of about 450° C. to 600° C. In this embodiment, the impurities are n-type, such as arsenic or phosphorus. Alternatively, the impurities are p-type, such as boron.

In an exemplary embodiment, an implantation process is performed to form lightly doped source/drain regions 205 in the semiconductor substrate 200 not covered by the gate stack 203. Preferably, the lightly doped source/drain regions 205 are formed by implanting n-type impurities such as arsenic or phosphorus into the semiconductor substrate 200 using the gate stack 203 as a mask. Alternatively, the impurities are of p-type, such as boron.

As shown in FIG. 2, spacers 210 comprising a first inner spacer 206 and a second outer spacer 208 are formed on sidewalls of the gate stack 205. In one embodiment, a first insulating layer (not shown) is blanketly deposited over the entire region. The first insulating layer is preferably a silicon oxide layer formed by a deposition process, for example, plasma enhanced CVD (PECVD) or low pressure CVD (LPCVD). The first insulating layer preferably serves a liner layer having a thickness of from about 75 Angstroms to about 150 Angstroms. Preferably, the first insulating layer is formed using a tetraethylorthosilicate (TEOS) precursor and a source of oxygen, preferably ozone ($O_3$) or an $O_2/O_3$ mixture, however other types of silicon oxide precursors may be used, e.g., silane. The first insulating layer is preferably subject to a furnace or rapid thermal anneal (RTA), more preferably RTA, between about 800° C. to about 1100° C. for densifying thereby reducing an etching rate in diluted HF acid. In addition, the RTA anneal process may be carried out as a simultaneous activation process of a previous lightly doped source/drain regions 205 implantation.

Secondly, a second insulating layer (not shown) is blanketly deposited on the first insulating layer. The second insulating layer may comprise a nitride containing layer, preferably silicon nitride or silicon oxynitride (e.g., $SiO_xN_y$), more preferably silicon nitride, (e.g., $Si_3N_4$, SiN) by LPCVD or PECVD process at a temperature of about 500° C. to 700° C. The second insulating layer preferably has a thickness of greater than about 300 Angstroms. For example, silane and/or chlorosilane precursors such as silane ($SiH_4$), disilane ($Si_2H_6$), trisilane ($Si_3H_8$), dichlorosilane ($SiH_2Cl_2$), trichlorosilane ($SiHCl_3$), hexacholorodisilane ($Si_2Cl_6$) or combinations thereof may be use to form the second insulating layer. Optionally, another overlying silicon oxide layer (not shown) may be formed over the second insulating layer to form an oxide/nitride/oxide series of layers. In one embodiment, the first insulating layer and the second insulating layer are different materials. The second insulating layer preferably has an etching selectivity higher than that of the first insulating layer.

The second outer spacers 208 are then formed over sidewalls of the gate stack 203 by an anisotropic etching process such as a dry etching process to remove a part of the second insulating layer. The dry etching process, for example, plasma etching, typically comprises fluorine such as fluorocarbons and/or hydrofluorocarbons and $O_2$, and optionally an inert gas and/or nitrogen for precisely controlling the shape and length of the second outer spacers 208. The dry etching process has an etching selectivity higher to the first insulating layer for example, the etching selectivity of about 5 to 100 to the first insulating layer. Thus the semiconductor substrate 200 can be covered by the first insulating layer to avoid lattice crystal destruction. In one embodiment, the outer shape of the second spacers 208 is trapezoidal.

A wet etching process is subsequently performed to remove the first insulating layer not covered by the second outer spacers 208. First inner spacers 206 are then formed on sidewalls of the gate stack 205. In one embodiment, the first inner spacers 206 are L-shaped. The wet etching process may comprise RCA cleaning, UV ozone cleaning or HF (100 parts water to 1 part 50% HF) immersion. The wet etching process may also use a wet cleaning to remove a native oxide layer. The first inner spacers 206 may have an undercut having a depth of below 100 Angstroms. Subsequent to the wet etching process, the first inner spacers 206 on sidewalls of the gate stack 205 and adjacent the semiconductor substrate 200 and the second outer spacers 208 on sidewalls of the first inner spacers 206 and adjacent a bottom portion thereof are then formed as shown in FIG. 2. The spacers 210 preferably have a height lower than the gate stack 205, thus a part of the sidewalls of the gate stack 205 are exposed.

Figure 3:
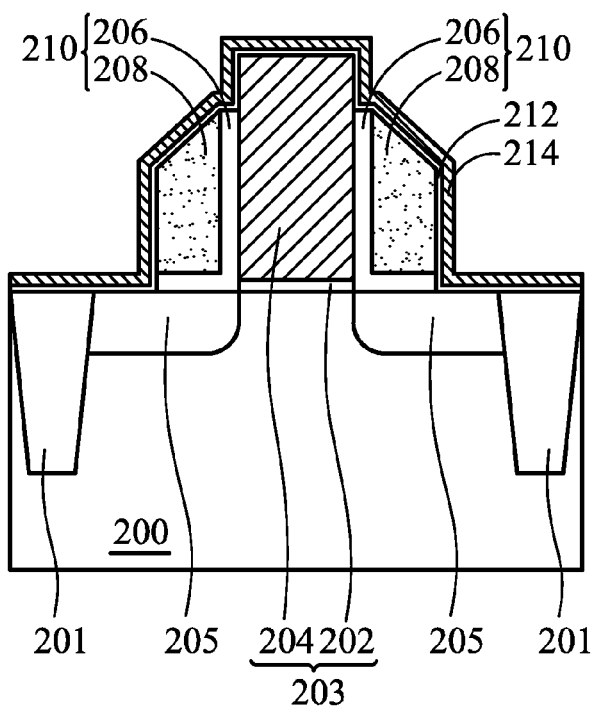
Figure 4:
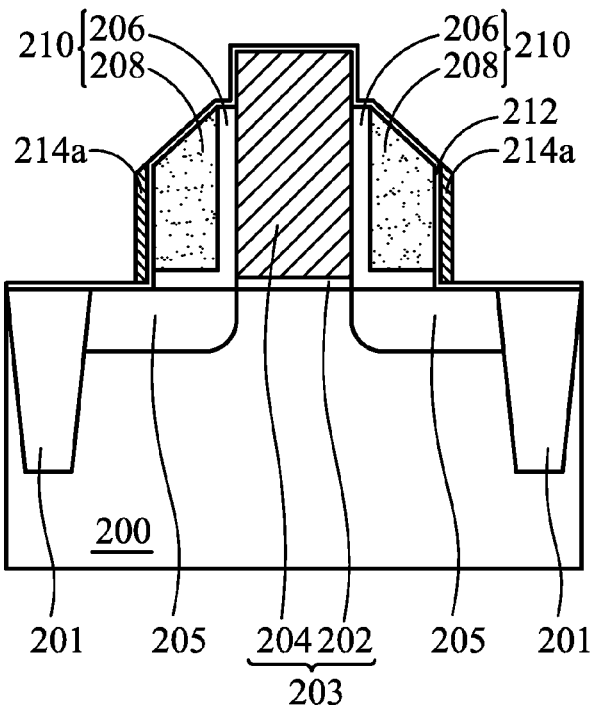
Figure 5:
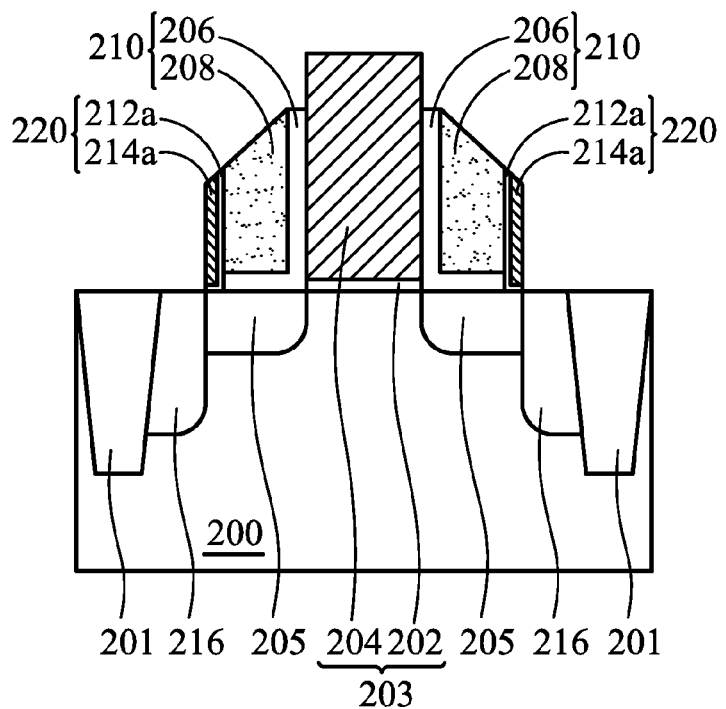

FIGS. 3 to 5 illustrate the process of forming a protective layer 220. Specifically, the protective layer 220 is used to seal a bottom portion of the first inner spacers 206, thereby avoiding the undercutting. For example as shown in FIG. 3, a third insulating layer 212 and a fourth insulating layer 214 may be conformally and sequentially formed. In one embodiment, the third insulating layer 212 may comprise a silicon oxide layer formed by a deposition process, for example, plasma enhanced CVD (PECVD) or low pressure CVD (LPCVD). The third insulating layer 212 preferably serves a liner layer having a thickness of from about 10 Angstroms to about 50 Angstroms. Preferably, the third insulating layer 212 is formed using a tetraethylorthosilicate (TEOS) precursor and a source of oxygen, preferably ozone ($O_3$) or an $O_2/O_3$ mixture, however other types of silicon oxide precursors may be used, e.g., silane. The fourth insulating layer 214 may comprise a nitride containing layer, preferably silicon nitride or silicon oxynitride (e.g., $SiO_xN_y$), more preferably silicon nitride, (e.g., $Si_3N_4$, SiN) by LPCVD or PECVD process at a temperature of about 500° C. to 700° C. The fourth insulating layer 214 preferably has a thickness of about 50 Angstroms to about 200 Angstroms. For example, silane and/or chlorosilane precursors such as silane ($SiH_4$), disilane ($Si_2H_6$), trisilane ($Si_3H_8$), dichlorosilane ($SiH_2Cl_2$), trichlorosilane ($SiHCl_3$), hexacholorodisilane ($Si_2Cl_6$) or combinations thereof may be used to form the fourth insulating layer 214. In one embodiment, the third insulating layer 212 may comprise the same material as the first insulating spacers 203, and the fourth insulating layer 214 may have the same material with the second outer spacer 208. The fourth insulating layer 214 may have a higher etching selectivity than that of the third insulating layer 212.

Referring to FIG. 4, the fourth outer spacers 214a are then formed over sidewalls of the spacers 210 by an anisotropic etching process such as a dry etching process to remove a part of the fourth insulating layer 214. The dry etching process, for example, plasma etching, typically comprises fluorine such as fluorocarbons and/or hydrofluorocarbons and $O_2$, and optionally an inert gas and/or nitrogen. The dry etching process has an etching selectivity higher to the third insulating layer 212. For example, the dry etching has the etching selectivity of about 5 to 100 to the third insulating layer 212. Thus the semiconductor substrate 200 can be covered by the third insulating layer 212 to avoid lattice crystal destruction.

Referring to FIG. 5, a wet etching process is performed to remove the third insulating layer 212 not covered by the fourth outer spacers 214a. The third inner spacers 212a are then formed on sidewalls of the spacers 210 covering a part of the semiconductor substrate 200. Specifically, the third inner spacers 212a seal the bottom portion of the first inner spacers 206. In one embodiment, the third inner spacers 212a are L-shape. The wet etching process may comprise RCA cleaning, UV ozone cleaning or diluted hydrofluoric (HF) acid (100 parts water to 1 part 50% HF) immersion. The wet etching process may also use a wet cleaning to remove a native oxide layer. Subsequent to the wet etching process, the protective layer 220 comprising the third inner spacers 212a and the fourth outer spacers 214a is then formed on sidewalls of the spacers 210 covering a part of the substrate 200 as shown in FIG. 5. In one embodiment, the protective layer 220 covers a part of the first inner spacers 206 and the second outer spacers 208 adjacent to the substrate 200. The fourth outer spacers 214a of the protective layer 220 may have a higher etching selectivity than that of the first inner spacer 206. The fourth outer spacers 214a of the protective layer 220 has an etching selectivity relative to the first inner spacers 206 in diluted hydrofluoric (HF) acid, for example, 5 to 100, to prevent the first inner spacers 206 made of silicon oxide from generating the undercutting by subsequence diluted HF acid immersion. In one embodiment, the protective layer 220 may be a composite layer comprising a silicon oxide layer and a nitride containing layer formed thereon. Alternatively, the protective layer 220 may be a single layer comprises silicon oxide, silicon nitride, silicon oxynitride, nitrogen doped silicon oxide or combinations thereof.

FIG. 5 also illustrates a formation of heavily doped source/drain regions 216. Preferably, the protective layer 220, the spacers 326 and the gate stack 350 are used as masks for the source/drain implantation process. Optionally, a patterned photoresist layer may be formed to define the heavily doped source/drain regions 216. The heavily doped source/drain regions 216 are then formed by implanting n-type impurities into the substrate 200. Alternatively, the impurities are of p-type, such as boron. The patterned photoresist layer is then removed.

Subsequent to the formation of heavily doped source/drain regions 216, an RPO (resistor protect oxide) layer (not shown) is formed over the entire region. The RPO layer is used to block silicide forbidden regions such as resistor regions or electrostatic discharge (ESD) regions to prevent subsequence silicide formed thereon. The RPO layer may comprise silicon oxide formed by plasma enhanced CVD (PECVD) at a temperature between about 350° C. to 400° C. A photolithography process and a following anisotropic etching process are performed to pattern the RPO layer for defining the aforementioned silicide prohibited regions. The protective layer 220 can also prevent undercutting of the silicon oxide first inner spacer 206 undercutting. Next, an annealing process is performed to activate the impurities not only in the heavily doped source/drain regions 216, but also in the gate electrode layer 204. The annealing process is preferably performed at a temperature of about 400° C. or higher. In one embodiment, the annealing process may be performed using thermal annealing, flash annealing, laser annealing, or the like.

Subsequent to the annealing process, the RPO layer is completely removed by a wet etching process. The wet etching process may comprise RCA cleaning, UV ozone cleaning or diluted hydrofluoric (HF) acid (100 parts water to 1 part 50% HF) immersion. The wet etching process may also use a wet cleaning to remove a native oxide layer. During the wet etching process, the protective layer 220 can prevent undercutting of the silicon oxide first inner spacers 206.

Figure 6:
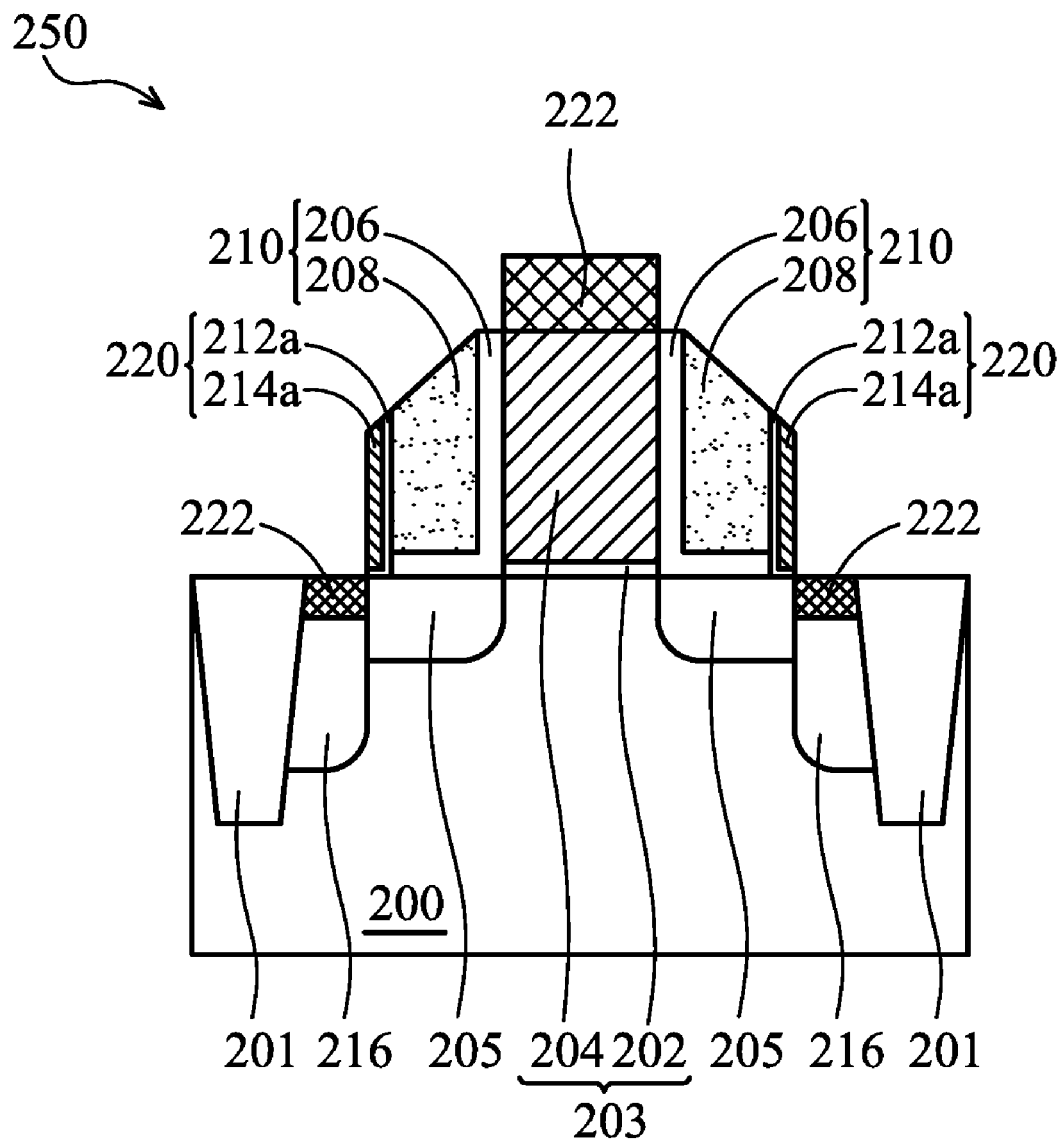

FIG. 6 illustrates formation of a metal silicide layer 222. Prior to formation of the metal silicide layer 222, a pre-metal cleaning process is performed to remove a native oxide layer by wet etching process. The wet etching process may comprise diluted hydrofluoric (HF) acid (100 parts water to 1 part 50% HF) immersion. The protective layer 220 formed on sidewalls of the spacers 210 can prevent the undercutting of the silicon oxide first inner spacers 206 due to the aforementioned diluted HF acid immersion. A thin metal layer (not shown) such as cobalt (Co), titanium (Ti), platinum (Pt) or nickel-based alloy is then conformally formed over the entire region. In one embodiment, a physical vapor deposition (PVD) process can be used for forming the metal layer, although other commonly used methods, such as sputtering, low pressure CVD (LPCVD), and atomic layer chemical vapor deposition (ALD), can also be used. In alternative embodiments, electroless plating, which can selectively form a metal layer on top of the gate stack 203 and the heavily doped source/drain regions 216, but not on the spacers 210 and protective layer 220, is used for forming the metal layer.

An annealing process is then performed to form the metal silicide layer 222 on top of the gate stack 203 and the heavily doped source/drain regions 216. The annealing is preferably performed at a temperature of about 400° C. or higher, although a lower temperature is more preferable. In one embodiment, the annealing process may be thermal annealing, flash annealing, laser annealing, or similar. During the annealing process, a portion of the metal layer reacts with silicon to form the metal silicide layer 222. Un-reacted portions of the metal layer, for example, the metal layer formed on the spacers 210 and protective layer 220, are then removed in a solution comprised of $H_2O_2$—$NH_4OH$ at a temperature between about 50° C. to 100° C. as shown on FIG. 6. In the aforementioned description, the protective layer 220 formed on sidewalls of the spacers 210 can prevent undercutting of the first inner spacers 206 by the aforementioned diluted HF acid immersion. A distance from the metal silicide layer 222 to the gate stack 203 is thus kept to prevent shorts or leakage of the semiconductor device. Thus, the fabrication of a semiconductor device 250 is complete.

In the previous embodiment, the semiconductor device 250 may be a MOS device comprising a NMOS device. In other embodiments, the semiconductor device 250 may be a PMOS device. The substrate 200 is n-type, and the impurities in the gate electrode layer 204, the lightly doped source/drain regions 205 and the heavily doped source/drain regions 216 are p-type.

In the exemplary embodiments, the protective layer formed on sidewalls of the spacers has a high etching selectivity of about 5 to 100 relative to the first inner spacer in diluted hydrofluoric (HF) acid, or a higher etching selectivity than that of the first inner spacer. Thus the protective layer can prevent the first inner spacer made of, for example, silicon oxide from generating undercutting by diluted HF acid immersion, even dry etching process. A distance from the metal silicide layer to the gate stack is thus kept to prevent shorts or leakage of the semiconductor device, avoiding short channel effects (SCE) and improving gate oxide integrity (GOI). The process of fabricating the protective layer is similar to the process of fabricating the spacers without additional process development.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, comprising:
    providing a semiconductor substrate;
    forming a gate stack overlying the semiconductor substrate;
    forming spacers, each spacer comprising a first inner spacer and an second outer spacer on sidewalls of the gate stack, wherein the first inner spacer is formed directly on the sidewall of the gate stack and adjacent the semiconductor substrate and the second outer spacer covers a sidewall of the first inner spacer and adjacent a bottom portion thereof;
    conformably and sequentially forming a third insulating liner layer and a fourth insulating layer covering the gate stack and the spacers, wherein the third insulating liner layer comprises substantially the same material as the first inner spacer and the fourth insulating layer comprises substantially the same material was the second outer spacer;
    removing a part of the fourth insulating layer covering the gate stack and upper surfaces of the spacers to form fourth outer spacers over sidewalls of the spacers, wherein the semiconductor substrate is covered by the third insulating layer to avoid lattice crystal destruction; and
    removing the third insulating layer not covered by the fourth outer spacers to form the third inner spacers after forming the fourth outer spacers, thereby forming a protective layer on a part of the sidewalls of the spacers, covering a part of the semiconductor substrate, wherein an etching selectivity of the protective layer is higher than that of the first inner spacer.

2. The method of fabricating the semiconductor device as claimed in claim 1, wherein the first inner spacer is L-shape.

3. The method of fabricating the semiconductor device as claimed in claim 1, wherein the second outer spacer has an etching selectivity higher than that of the first inner spacer.

4. The method of fabricating the semiconductor device as claimed in claim 1, wherein the protective layer and the first inner spacer comprise different materials.

5. The method of fabricating the semiconductor device as claimed in claim 1, wherein the protective layer comprises silicon oxide, silicon nitride, silicon oxynitride, nitrogen doped silicon oxide or combinations thereof.

6. The method of fabricating the semiconductor device as claimed in claim 1, wherein the first inner spacer or the second outer spacer comprises silicon oxide, silicon nitride, silicon oxynitride, nitrogen doped silicon oxide or combinations thereof.

7. The method of fabricating the semiconductor device as claimed in claim 1, wherein the protective layer has an etching selectivity of 5 to 100 relative to the first inner spacer in diluted hydrofluoric (HF) acid.

8. The method of fabricating the semiconductor device as claimed in claim 1, further comprising:
    performing an implantation process to form a lightly doped source/drain regions in the semiconductor substrate not covered by the gate stack prior to forming the spacers.

9. The method of fabricating the semiconductor device as claimed in claim 1, wherein the protective layer is a composite layer comprising a silicon oxide layer and a nitride containing layer formed thereon.

10. The method of fabricating the semiconductor device as claimed in claim 9, wherein the silicon oxide layer has a thickness of between about 15 Angstroms to about 50 Angstroms.

11. The method of fabricating the semiconductor device as claimed in claim 9, wherein the nitride containing layer has a thickness of between about 50 Angstroms to about 200 Angstroms.

12. The method of fabricating the semiconductor device as claimed in claim 1, further comprising:
performing an implantation process to form a heavily doped source/drain regions in the semiconductor substrate not covered by the gate stack, the spacers and the protective layer subsequent to forming the protective layer.

13. The method of fabricating the semiconductor device as claimed in claim 12, further comprising:
forming a metal silicide layer on top of the gate stack and the heavily doped source/drain regions.

14. A method of fabricating a semiconductor device, comprising:
providing a semiconductor substrate;
forming a gate stack on the semiconductor substrate;
forming first inner spacers and second outer spacers on sidewalls of the gate stack, wherein the first inner spacers are directly on the sidewalls of the gate stack and adjacent the semiconductor substrate and the second outer spacers cover a sidewall of the first inner spacer and adjacent a bottom portion thereof;
conformably and sequentially forming a third insulating liner layer and a fourth insulating layer covering the gate stack, the first inner spacers and the second outer spacers, wherein the third insulating liner layer comprises substantially the same material as the first inner spacers and the fourth insulating layer comprises substantially the same material as the second outer spacers;
removing a part of the fourth insulating layer covering the gate stack and upper surfaces of the first inner spacers and the second outer spacers to form fourth outer spacers over sidewalls of the spacers, wherein the semiconductor substrate is covered by the third insulating layer to avoid lattice crystal destruction; and
removing the third insulating layer not covered by the fourth outer spacers to form the third inner spacers after forming the fourth outer spacers, thereby forming a protective layer covering a part of the first inner spacers, a part of the second outer spacers and a part of the semiconductor substrate, wherein the protective layer has an etching selectivity of 5 to 100 relative to the first inner spacer in diluted hydrofluoric (HF) acid.

15. The method of fabricating the semiconductor device as claimed in claim 14, wherein the first inner spacers and the second outer spacers comprise different materials.

16. The method of fabricating the semiconductor device as claimed in claim 14, wherein inner third insulating spacer seals a bottom portion of the first inner spacers.

17. The method of fabricating the semiconductor device as claimed in claim 14, wherein the first inner spacers or the second outer spacers comprise silicon oxide, silicon nitride, silicon oxynitride, nitrogen doped silicon oxide or combinations thereof.

18. The method of fabricating the semiconductor device as claimed in claim 14, further comprising:
performing an implantation process to form a lightly doped source/drain region in the semiconductor substrate not covered by the gate stack prior to forming the spacers.

19. The method of fabricating the semiconductor device as claimed in claim 14, further comprising:
performing an implantation process to form a heavily doped source/drain regions in the semiconductor substrate not covered by the gate stack, the spacers and the protective layer subsequent to forming the protective layer.

20. The method of fabricating the semiconductor device as claimed in claim 19, further comprising:
forming a metal silicide layer on top of the gate stack and the heavily doped source/drain regions.

21. A method of fabricating a semiconductor device, comprising:
providing a semiconductor substrate;
forming a gate stack overlying the semiconductor substrate;
forming spacers each comprising a first inner spacer and an second outer spacer on sidewalls of the gate stack, wherein the first inner spacer is directly on the sidewall of the gate stack and adjacent the semiconductor substrate and the second outer spacer covers a sidewall of the first inner spacer and adjacent a bottom portion thereof;
conformably and sequentially forming a third insulating liner layer and a fourth insulating layer covering the gate stack and the spacers, wherein the third insulating liner layer comprises substantially the same material as the first inner spacer and the fourth insulating layer comprises substantially the same material as the second outer spacer;
removing a part of the fourth insulating layer covering the gate stack and upper surfaces of the spacers to form fourth outer spacers over sidewalls of the spacers, wherein the semiconductor substrate is covered by the third insulating layer to avoid lattice crystal destruction; and
removing the third insulating layer not covered by the fourth outer spacers to form the third inner spacers after forming the fourth outer spacers, thereby forming a protective layer on a part of the sidewalls of the spacers, sealing a bottom portion of the first inner spacer, wherein an etching selectivity of the protective layer is higher than that of the first inner spacer.

* * * * *